(12) United States Patent
Goto et al.

(10) Patent No.: US 10,920,179 B2
(45) Date of Patent: Feb. 16, 2021

(54) CLEANING SOLUTION AND METHOD FOR CLEANING SUBSTRATE

(71) Applicant: TOKYO OHKA KOGYO CO., LTD., Kawasaki (JP)

(72) Inventors: Tatsuo Goto, Kawasaki (JP); Kenji Seki, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

(21) Appl. No.: 16/348,063

(22) PCT Filed: Oct. 24, 2017

(86) PCT No.: PCT/JP2017/038387
§ 371 (c)(1),
(2) Date: May 7, 2019

(87) PCT Pub. No.: WO2018/088202
PCT Pub. Date: May 17, 2018

(65) Prior Publication Data
US 2019/0256805 A1      Aug. 22, 2019

(30) Foreign Application Priority Data
Nov. 10, 2016   (JP) ................ 2016-231830

(51) Int. Cl.
| | | |
|---|---|---|
| C11D 7/50 | (2006.01) | |
| C11D 7/08 | (2006.01) | |
| C11D 7/32 | (2006.01) | |
| H01L 21/304 | (2006.01) | |
| C11D 3/37 | (2006.01) | |
| G03F 7/42 | (2006.01) | |
| H01L 21/027 | (2006.01) | |
| C11D 11/00 | (2006.01) | |
| H01L 21/02 | (2006.01) | |
| C08F 120/58 | (2006.01) | |
| C08F 126/10 | (2006.01) | |
| C08F 120/54 | (2006.01) | |
| C08F 26/10 | (2006.01) | |
| C08F 20/54 | (2006.01) | |

(52) U.S. Cl.
CPC .............. *C11D 7/08* (2013.01); *C11D 3/3773* (2013.01); *C11D 3/3776* (2013.01); *C11D 7/3281* (2013.01); *C11D 7/50* (2013.01); *C11D 7/5013* (2013.01); *G03F 7/423* (2013.01); *H01L 21/027* (2013.01); *H01L 21/304* (2013.01); *C08F 20/54* (2013.01); *C08F 26/10* (2013.01); *C08F 120/54* (2013.01); *C08F 120/58* (2013.01); *C08F 126/10* (2013.01); *C11D 11/0047* (2013.01); *H01L 21/0206* (2013.01)

(58) Field of Classification Search
CPC ...................... C11D 11/0047; C11D 7/5013
USPC ......................... 510/175; 252/79.1
See application file for complete search history.

(56) References Cited

U.S. PATENT DOCUMENTS

| | | |
|---|---|---|
| 5,792,274 A | 8/1998 | Tanabe et al. |
| 6,638,899 B1 | 10/2003 | Wakiya et al. |
| 2010/0112728 A1* | 5/2010 | Korzenski .............. C09K 13/08 438/3 |
| 2017/0330762 A1* | 11/2017 | Kamei ................. H01L 21/3212 |
| 2018/0226267 A1* | 8/2018 | Hayama ............ H01L 21/31133 |
| 2019/0071623 A1* | 3/2019 | Kamimura .............. G03F 7/423 |
| 2019/0136161 A1* | 5/2019 | Kamimura ................ C11D 7/10 |
| 2019/0177670 A1* | 6/2019 | Kamimura .......... C11D 11/0047 |
| 2019/0203027 A1* | 7/2019 | Chen ...................... C08L 39/06 |

FOREIGN PATENT DOCUMENTS

| | | |
|---|---|---|
| JP | H09-197681 A | 7/1997 |
| JP | 2000-047401 A | 2/2000 |
| JP | 2000-181083 A | 6/2000 |
| JP | 2001-083713 A | 3/2001 |
| JP | 2003-059866 A | 2/2003 |
| JP | 2011-040576 A | 2/2011 |

* cited by examiner

*Primary Examiner* — Gregory E Webb
(74) *Attorney, Agent, or Firm* — Knobbe Martens Olson & Bear LLP

(57) ABSTRACT

A cleaning solution that is used, inter alia, for removal of residue of a photoresist pattern or etching residue, and has exceptional anticorrosion properties with respect to silicon nitride; and a method for cleaning a substrate using the cleaning solution. In a cleaning solution containing a hydrofluoric acid and a solvent, a polymer that includes units derived from a compound of a specific structure having a carboxylic acid amide bond (—CO—N<) and an unsaturated double bond is blended as an anticorrosive agent. Polyvinylpyrrolidone is preferred as the polymer used as the anticorrosive agent.

8 Claims, No Drawings

CLEANING SOLUTION AND METHOD FOR CLEANING SUBSTRATE

This application is the U.S. National Phase under 35 U.S.C. § 371 of International Application PCT/JP2017/038387, filed Oct. 24, 2017, designating the U.S., and published in Japanese as WO 2018/088202 on May 17, 2018 which claims priority to Japanese Patent Application No. 2016-231830, filed Nov. 10, 2016, the entire content of which is incorporated herein by reference.

TECHNICAL FIELD

The present invention relates to a cleaning solution and a method for cleaning a substrate using the same.

BACKGROUND ART

When semiconductor elements such as IC and LSI, or display elements such as liquid crystal panels are manufactured, a CVD vapor-deposited metal film or an insulating film such as a $SiO_2$ film is first formed on a substrate such as a silicon wafer or glass. Next, a photoresist pattern or a metal hard mask is formed on the metal film or the insulating film. Then, the substrate is subjected to dry etching using this photoresist pattern or hard mask as a mask to form a fine circuit. Next, after ashing, photoresist pattern residues and hard mask residues are cleaned and removed using a cleaning solution.

It is commonly desired that the cleaning solution, which can be used to clean and remove the photoresist pattern residues and hard mask residues, be able to effectively clean and remove these residues and also have excellent anticorrosion properties to metals. It has been proposed that a compound of hydrofluoric acid and ammonia used as a counter amine thereof (see Patent Documents 1 to 3), a compound of hydrofluoric acid and 1,8-diazabicyclo[5.4.0]undecene-7 used as a counter amine thereof (see Patent Document 4), or the like, is used for such a cleaning solution.

Patent Document 1: Japanese Unexamined Patent Application, Publication No. 2001-83713
Patent Document 2: Japanese Unexamined Patent Application, Publication No. H09-197681
Patent Document 3: Japanese Unexamined Patent Application, Publication No. 2000-47401
Patent Document 4: Japanese Unexamined Patent Application, Publication No. 2000-181083

DISCLOSURE OF THE INVENTION

Problems to be Solved by the Invention

Here, a stopper layer is provided to protect a material not to be polished at the time of chemical mechanical polishing (CMP) in the manufacture of e.g. semiconductor devices. As a material for the stopper layer, silicon nitride, a hard material, has been widely used. Because of this, the surface of a substrate to be cleaned by cleaning solutions described in Patent Documents 1 to 4 often includes a surface having silicon nitride.

However, the cleaning solutions including hydrofluoric acid described in Patent Documents 1 to 4 easily corrode silicon nitride. In a case where silicon nitride is corroded, there is a possibility that a material originally not to be polished is polished at the time of CMP.

The present invention has been made in consideration of the above-described problems and an object thereof is to provide a cleaning solution which is used, for example, to remove photoresist pattern residues or etching residues and has excellent anticorrosion properties to silicon nitride, and a method for cleaning a substrate using the same.

Means for Solving the Problems

The present inventors have found that it is possible to solve the above-described problems by blending a polymer including a unit derived from a compound with a specific structure having a carboxylic acid amide bond (—CO—N<) and a unsaturated double bond as a corrosion inhibitor (B) in a cleaning solution including hydrofluoric acid (A) and a solvent (S), thereby completing the present invention. More specifically, the present invention provides the following.

A first aspect of the present invention is a cleaning solution including hydrofluoric acid (A), a corrosion inhibitor (B) and a solvent (S), wherein the corrosion inhibitor includes a polymer including one or more units represented by the following formula (b1) or formula (b2):

[Chem. 1]

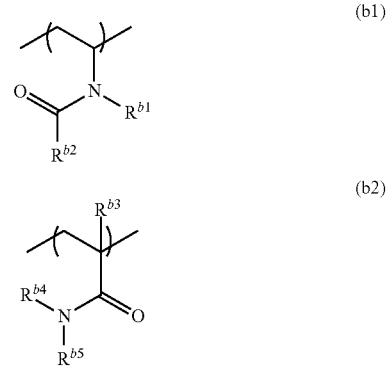

(in the formula (b1), $R^{b1}$ and $R^{b2}$ are each independently a hydrogen atom or a hydrocarbon group having 1 or more 6 or less carbon atoms, and $R^{b1}$ and $R^{b2}$ may be bound to each other to form a ring, and in the formula (b2), $R^{b3}$ is a hydrogen atom or a methyl group, and $R^{b4}$ and $R^{b5}$ are each independently a hydrogen atom, or a hydrocarbon group having 1 or more 6 or less carbon atoms which may be substituted with one or more hydroxy groups, and $R^{b4}$ and $R^{b5}$ may be bound to each other to form a ring).

A second aspect of the present invention is a method for cleaning a substrate using the cleaning solution according to the first aspect.

Effects of the Invention

According to the present invention, it is possible to provide a cleaning solution which is used, for example, to remove photoresist pattern residues or etching residues and has excellent anticorrosion properties to silicon nitride, and a method for cleaning a substrate using the same.

PREFERRED MODE FOR CARRYING OUT THE INVENTION

<<Cleaning Solution>>

The cleaning solution includes hydrofluoric acid (A), a corrosion inhibitor (B) and a solvent (S). The cleaning solution includes as a corrosion inhibitor (B) a polymer including one or more units represented by the following formula (b1) or formula (b2):

[Chem. 2]

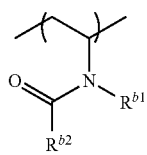
(b1)

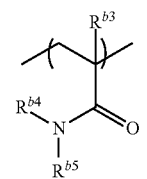
(b2)

(in the formula (b1), $R^{b1}$ and $R^{b2}$ are each independently a hydrogen atom or a hydrocarbon group having 1 or more 6 or less carbon atoms, and $R^{b1}$ and $R^{b2}$ may be bound to each other to form a ring, and in the formula (b2), $R^{b3}$ is a hydrogen atom or a methyl group, and $R^{b4}$ and $R^{b5}$ are each independently a hydrogen atom, or a hydrocarbon group having 1 or more 6 or less carbon atoms which may be substituted with one or more hydroxy groups, and $R^{b4}$ and $R^{b5}$ may be bound to each other to form a ring). The cleaning solution includes the above polymer and thus has excellent anticorrosion properties to silicon nitride. Essential or optional components included in the cleaning solution will now be described in detail.

<Hydrofluoric Acid (A)>

The cleaning solution essentially includes hydrofluoric acid. The amount of hydrofluoric acid included is preferably 0.001 mass % or more 0.5 mass % or less and more preferably 0.08 mass % or more 0.32 mass % or less in the cleaning solution. In a case where the amount of hydrofluoric acid included falls within such a range, a balance between properties of cleaning and removing photoresist pattern residues and etching residues and anticorrosion properties to silicon nitride can be more effectively achieved.

<Corrosion Inhibitor (B)>

The cleaning solution essentially includes as a corrosion inhibitor (B) a polymer including one or more units represented by the following formula (b1) or formula (b2):

[Chem. 3]

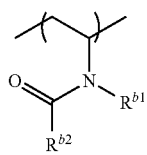
(b1)

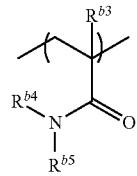
(b2)

(in the formula (b1), $R^{b1}$ and $R^{b2}$ are each independently a hydrogen atom or a hydrocarbon group having 1 or more 6 or less carbon atoms, and $R^{b1}$ and $R^{b2}$ may be bound to each other to form a ring, and in the formula (b2), $R^{b3}$ is a hydrogen atom or a methyl group, and $R^{b4}$ and $R^{b5}$ are each independently a hydrogen atom, or a hydrocarbon group having 1 or more 6 or less carbon atoms which may be substituted with one or more hydroxy groups, and $R^{b4}$ and $R^{b5}$ may be bound to each other to form a ring). The cleaning solution includes a corrosion inhibitor (B), and accordingly the anticorrosion properties of the cleaning solution to silicon nitride are significantly increased.

The mass average molecular weight of the above polymer including a unit represented by the formula (b1) and/or a unit represented by the formula (b2) is not particularly limited as long as a desired anticorrosive effect is obtained. The mass average molecular weight of the above polymer is preferably 1000 or more 2000000 or less, more preferably 5000 or more 500000 or less, further preferably 10000 or more 300000 or less, further more preferably 40000 or more 200000 or less, particularly preferably 80000 or more 1800000 or less, and most preferably 100000 or more 160000 or less. It should be noted that when the mass average molecular weight of the polymer is above 2000000, a cleaning solution can be prepared; however, when the polymer is dissolved in a solvent (S) described below, there is a possibility that a long time and heating are required. As described above, when a polymer having a mass average molecular weight within the above range is used, it is easy that the polymer, a corrosion inhibitor (B), is uniformly dissolved in a cleaning solution, and a desired anticorrosive effect on silicon nitride is easily obtained.

The polymer including a unit represented by the formula (b1) and/or a unit represented by the formula (b2) can be a polymer having only a unit represented by the formula (b1) and/or a unit represented by the formula (b2), or a copolymer including another unit other than a unit represented by the formula (b1) and a unit represented by the formula (b2).

In a case where the above polymer includes another unit other than a unit represented by the formula (b1) and a unit represented by the formula (b2), examples of monomer compounds providing another unit include unsaturated carboxylic acids, (meth)acrylic acid alkyl esters, (meth)acrylic acid hydroxyalkyl esters, (meth)acrylates having an ether bond, (meth)acrylates other than the above, allyl compounds, vinyl ethers, vinyl esters, styrenes, dicarboxylic acid diesters, conjugated diolefins, nitrile group-containing polymerizable compounds and chlorine-containing polymerizable compounds. The amount of another unit included in the polymer is preferably 30 mass % or less, more preferably 20 mass % or less, and further preferably 10 mass % or less. The polymer having only a unit represented by the formula (b1) and/or a unit represented by the formula (b2) is most preferable.

Examples of unsaturated carboxylic acids include monocarboxylic acids such as (meth)acrylic acid and crotonic acid; maleic acid, fumaric acid, citraconic acid, mesaconic acid, itaconic acid and the like.

Examples of (meth)acrylic acid alkyl esters include linear or branched alkyl (meth)acrylates such as methyl (meth)acrylate, ethyl (meth)acrylate, n-propyl (meth)acrylate, n-butyl (meth)acrylate, amyl (meth)acrylate, tert-octyl (meth)acrylate and the like.

Examples of (meth)acrylic acid hydroxyalkyl esters include 2-hydroxyethyl (meth)acrylate, 2-hydroxypropyl (meth)acrylate, 2-dimethylhydroxypropyl (meth)acrylate, trimethylolpropane mono(meth)acrylate and the like.

Examples of (meth)acrylates having an ether bond include 2-methoxyethyl (meth)acrylate, methoxytriethylene glycol (meth)acrylate, 3-methoxybutyl (meth)acrylate, ethyl carbitol (meth)acrylate, phenoxypolyethylene glycol (meth)acrylate, methoxypolypropylene glycol (meth)acrylate, and tetrahydrofurfuryl (meth)acrylate, and 2-methoxyethyl (meth) acrylate and methoxytriethylene glycol (meth)acrylate are preferable.

Examples of (meth)acrylates other than the above include chloroethyl (meth)acrylate, benzyl (meth)acrylate, and phenyl (meth)acrylate.

Examples of allyl compounds include allyl esters such as allyl acetate, allyl caproate, allyl caprylate, allyl laurate, allyl palmitate, allyl stearate, allyl benzoate, allyl acetoacetate and allyl lactate; allyloxyethanol; and the like.

Examples of vinyl ethers include alkylvinyl ethers such as hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether and tetrahydrofurfuryl vinyl ether; vinyl aryl ethers such as vinyl phenyl ether, vinyl tolyl ether, vinyl chlorophenyl ether, vinyl-2,4-dichlorophenyl ether, vinyl naphthyl ether and vinyl anthranyl ether; and the like.

Examples of vinyl esters include vinyl acetate, vinyl butyrate, vinyl isobutyrate, vinyl trimethyl acetate, vinyl diethyl acetate, vinyl valerate, vinyl caproate, vinyl chloroacetate, vinyl dichloroacetate, vinyl methoxyacetate, vinyl butoxyacetate, vinylphenyl acetate, vinyl acetoacetate, vinyl lactate, vinyl β-phenylbutyrate, vinyl benzoate, vinyl salicylate, vinyl chlorobenzoate, vinyl tetrachlorobenzoate, vinyl naphthoate and the like.

Examples of styrenes include styrene; alkyl styrenes such as methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene; alkoxy styrenes such as methoxystyrene, 4-methoxy-3-methylstyrene and dimethoxystyrene; halostyrenes such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene and 4-fluoro-3-trifluoromethylstyrene; and the like.

Examples of dicarboxylic acid diesters include diethyl maleate and dibutyl fumarate.

Examples of conjugated diolefins include butadiene and isoprene.

Examples of nitrile group-containing polymerizable compounds include (meth)acrylonitrile.

Examples of chlorine-containing polymerizable compounds include vinyl chloride and vinylidene chloride.

The unit represented by the formula (b1) and unit represented by the formula (b2) will now be described.

In the following formula (b1):

[Chem. 4]

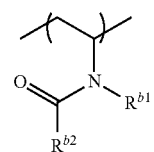

(b1)

$R^{b1}$ and $R^{b2}$ are each independently a hydrogen atom or a hydrocarbon group having 1 or more 6 or less carbon atoms, and $R^{b1}$ and $R^{b2}$ may be bound to each other to form a ring.

The hydrocarbon group having 1 or more 6 or less carbon atoms in $R^{b1}$ and $R^{b2}$ is not particularly limited as long as the group is configured from 1 or more 6 or less carbon atoms, and hydrogen atoms.

The hydrocarbon group having 1 or more 6 or less carbon atoms in each definition of $R^{b1}$ and $R^{b2}$ may be any of an aliphatic hydrocarbon group, an alicyclic hydrocarbon group and an aromatic hydrocarbon group, and may have an unsaturated bond. The structure of the hydrocarbon group may be any of linear, branched, cyclic and combinations of these structures.

Suitable examples of the hydrocarbon group having 1 or more 6 or less carbon atoms in $R^{b1}$ and $R^{b2}$ include an alkyl group, an alkenyl group, a cycloalkyl group, a cycloalkenyl group and an aryl group and the like.

In a case where $R^{b1}$ and/or $R^{b2}$ is an alkyl group or an alkenyl group, the alkyl group or the alkenyl group may be linear or branched as long as the number of carbon atoms is 1 or more 6 or less. Suitable specific examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group and an n-hexyl group and the like. Suitable specific examples of the alkenyl group include a vinyl group, an allyl group, a 3-butenyl group, a 2-butenyl group, a 1-butenyl group, a 4-pentenyl group, a 5-hexenyl group and the like.

In a case where $R^{b1}$ and/or $R^{b2}$ is a cycloalkyl group, suitable specific examples thereof include a cyclobutyl group, a cyclopentyl group and a cyclohexyl group and the like. In a case where $R^{b1}$ and/or $R^{b2}$ is a cycloalkenyl group, suitable examples thereof include cycloalkenyl groups corresponding to preferred groups exemplified as the cycloalkyl group.

In a case where $R^{b1}$ and/or $R^{b2}$ is an aryl group, suitable examples thereof are a phenyl group.

Examples of rings which may be formed by binding $R^{b1}$ and $R^{b2}$ each other include a pyrrolidone ring structure, a piperidone ring structure, an azepanone ring structure and the like.

Specific examples of the unit represented by the formula (b1) include units below.

[Chem. 5]
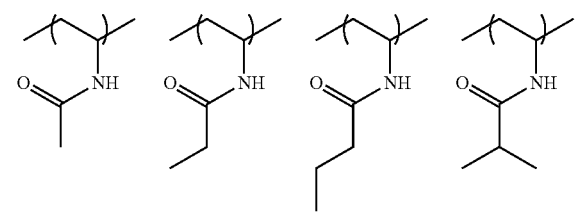
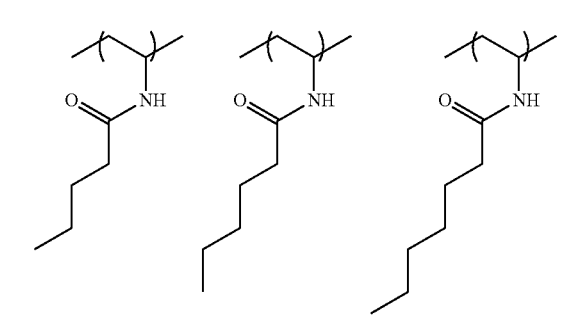
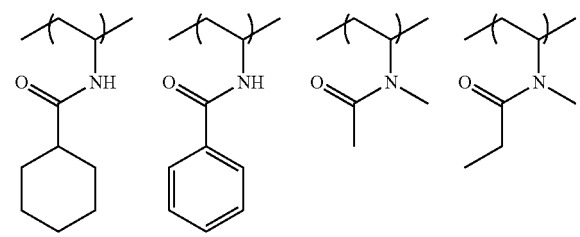
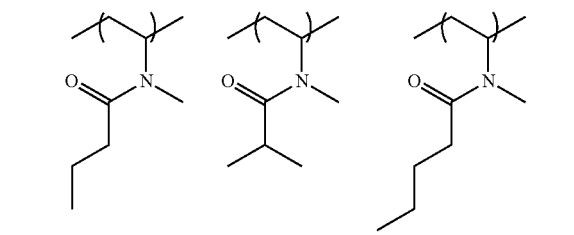
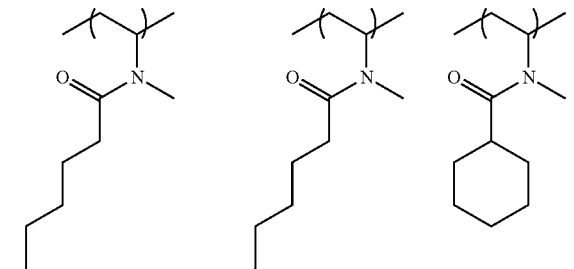
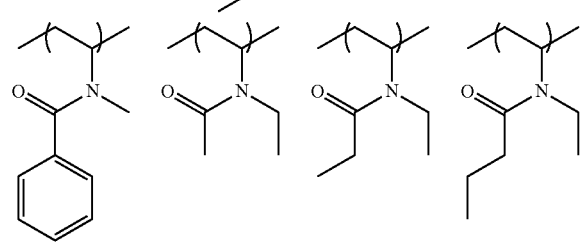
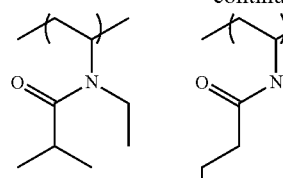
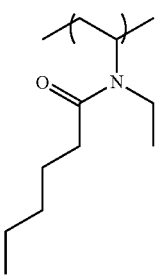
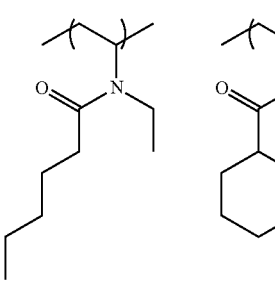
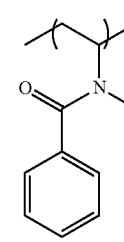
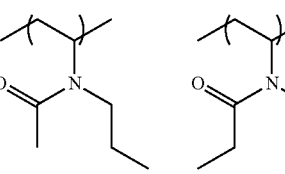
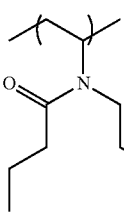

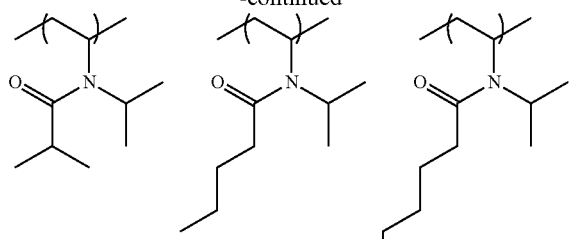
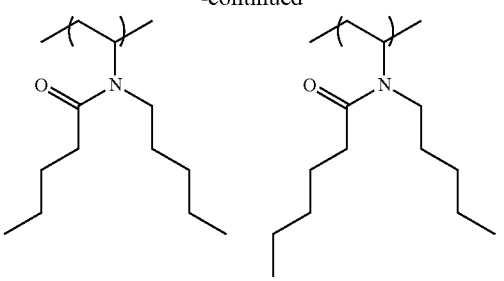
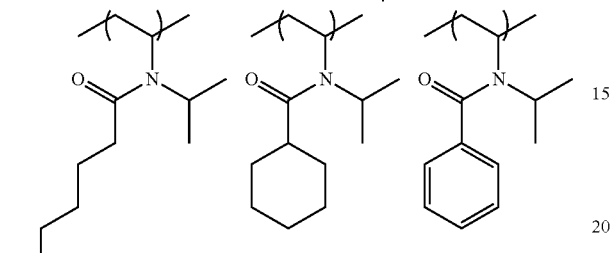
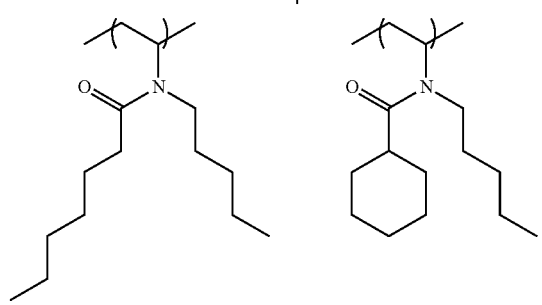
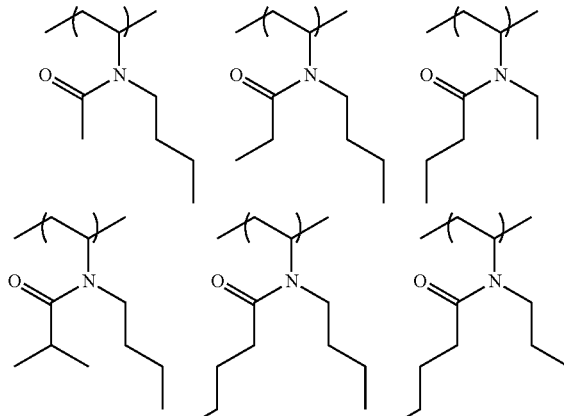
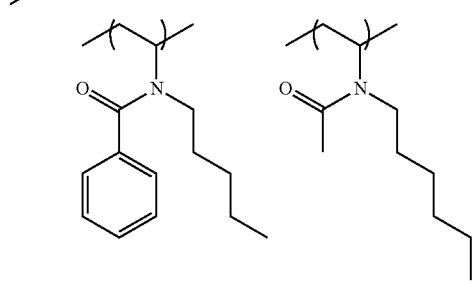
[Chem. 6]
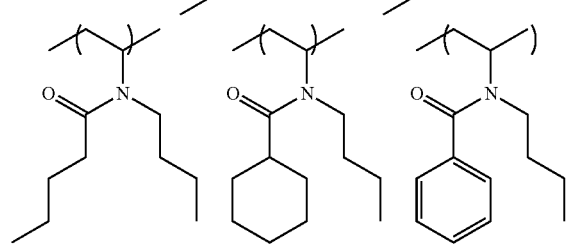
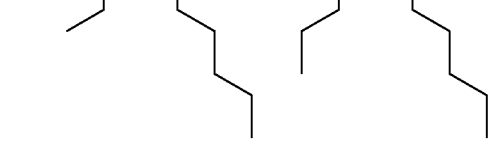
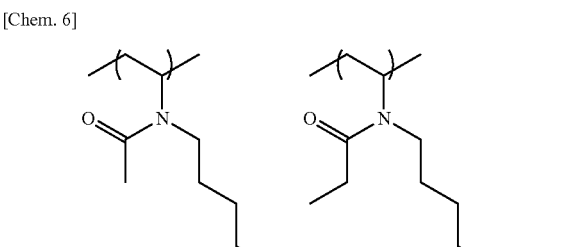
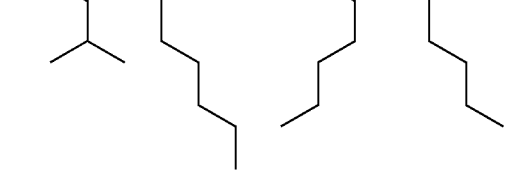
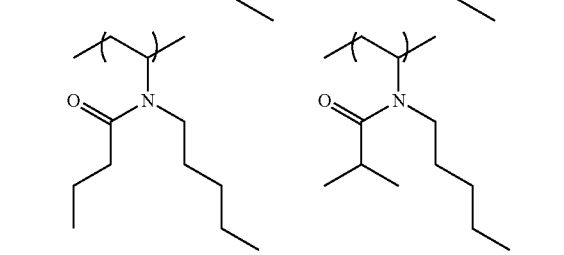
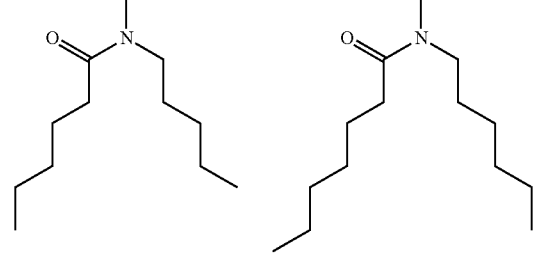

-continued

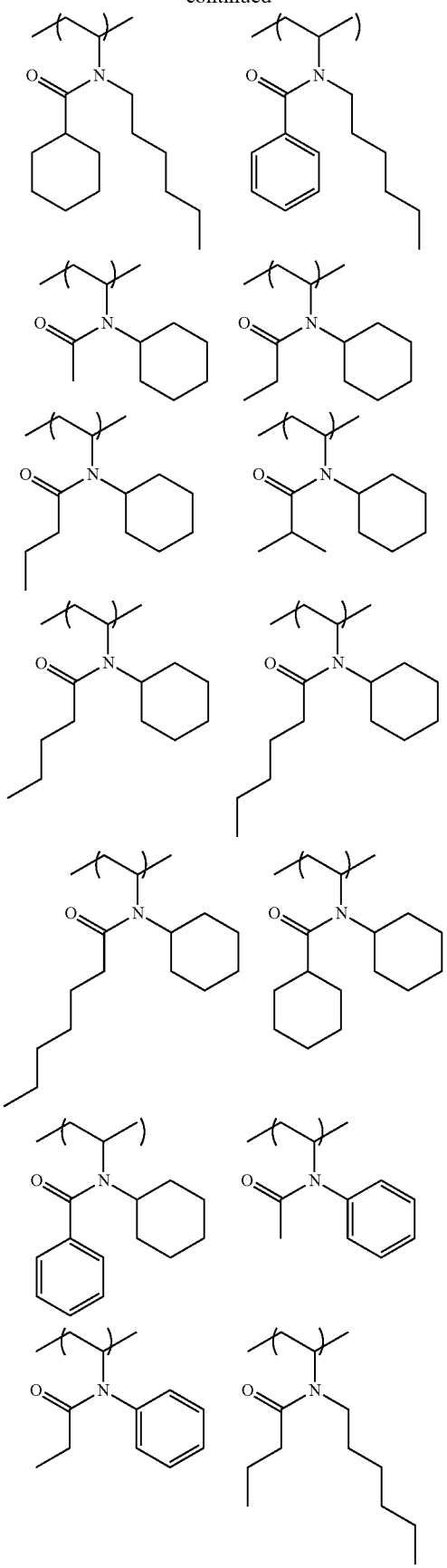

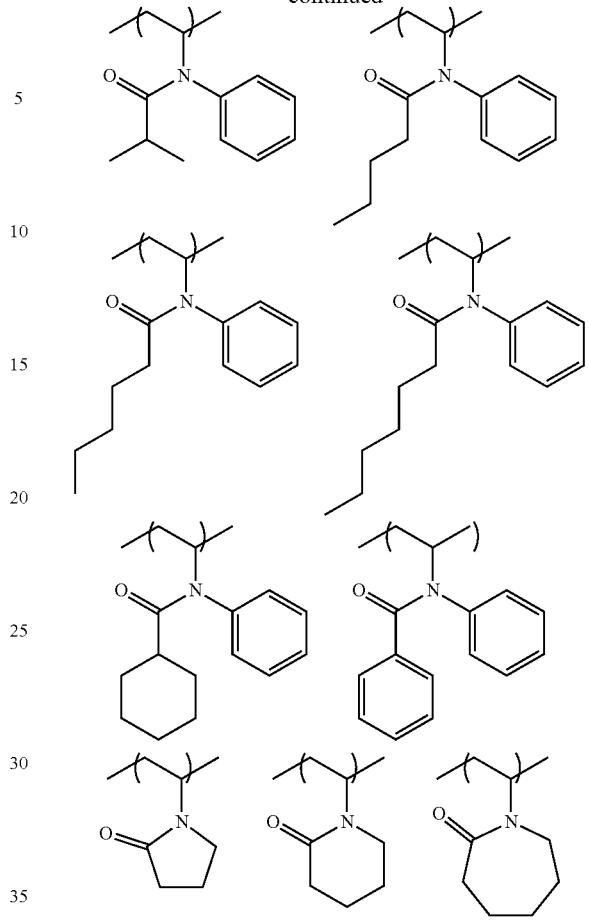

In the following formula (b2):

[Chem. 7]

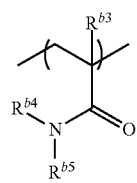

(b2)

$R^{b3}$ is a hydrogen atom or a methyl group, and $R^{b4}$ and $R^{b5}$ are each independently a hydrogen atom or a hydrocarbon group having 1 or more 6 or less carbon atoms, and $R^{b4}$ and $R^{b5}$ may be bound to each other to form a ring.

In a case where $R^{b4}$ and $R^{b5}$ are an unsubstituted hydrocarbon group having 1 or more 6 or less carbon atoms, the unsubstituted hydrocarbon groups having 1 or more 6 or less carbon atoms are the same as the hydrocarbon groups having 1 or more 6 or less carbon atoms in $R^{b1}$ and $R^{b2}$. In a case where $R^{b4}$ and $R^{b5}$ are a hydrocarbon group having 1 or more 6 or less carbon atoms which is substituted with one or more hydroxy groups, the number of substituted hydroxy groups is preferably 1. Suitable examples of the hydrocarbon group having 1 or more 6 or less carbon atoms which is substituted with a hydroxy group include a methylol group, a 2-hydroxyethyl group, a 3-hydroxypropyl group, a 4-hydroxybutyl group, a 5-hydroxypentyl group, a 6-hydroxyhexyl group, a 4-hydroxycyclopentyl group, a 4-hydroxyphenyl group, a 3-hydroxyphenyl group and a 2-hydroxyphenyl group. Among these, a methylol group, a 2-hydroxyethyl group and a 3-hydroxyethyl group are preferable, and a 2-hydroxyethyl group is more preferable. Examples of ring structures which may be formed by binding $R^{b1}$ and $R^{b2}$ each other include a pyrrolidine ring structure, a piperidine ring structure and a hexamethyleneimine ring structure.

Examples of the unit represented by the formula (b2) include units below.

[Chem. 8]

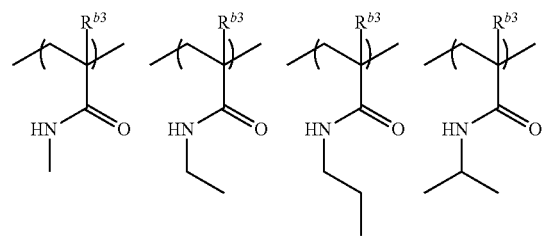

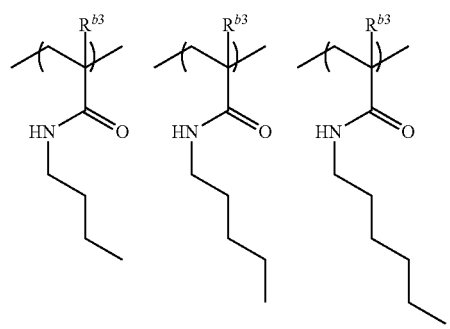

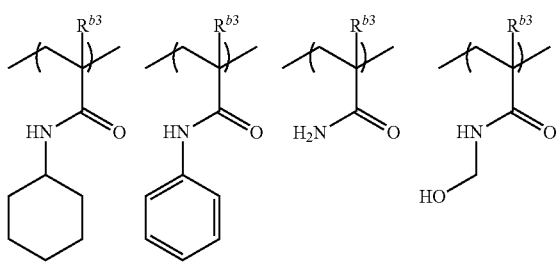

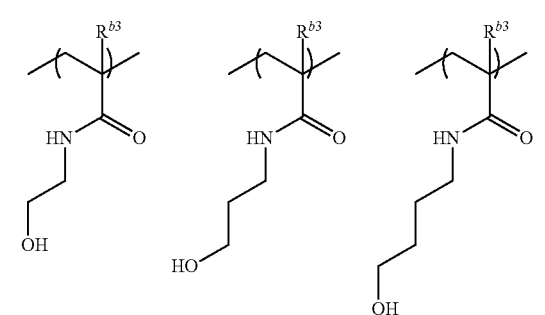

-continued

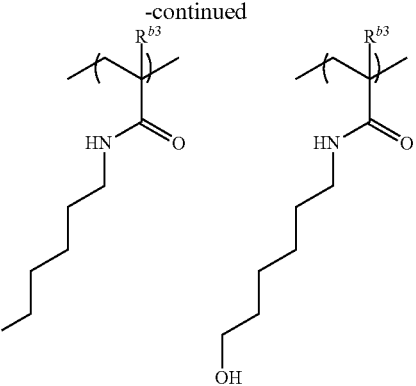

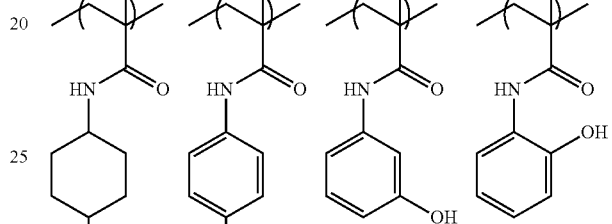

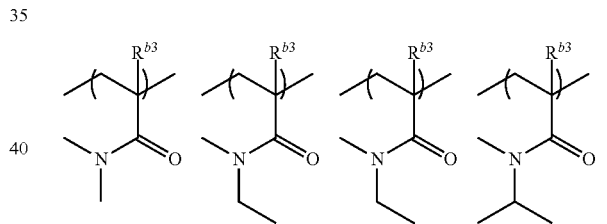

[Chem. 9]

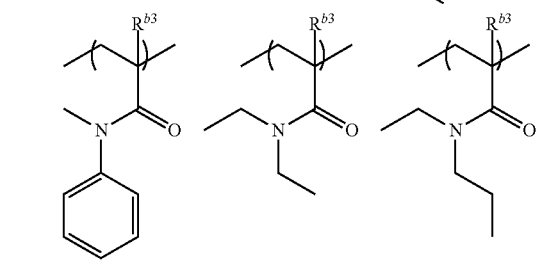

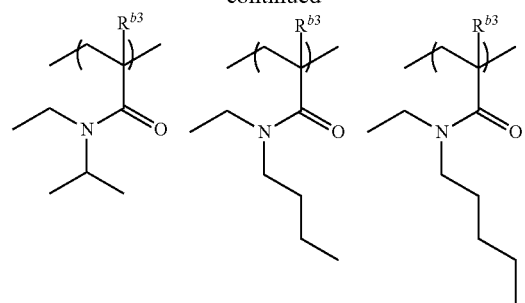
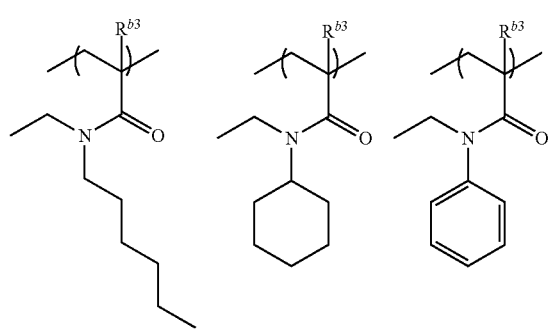
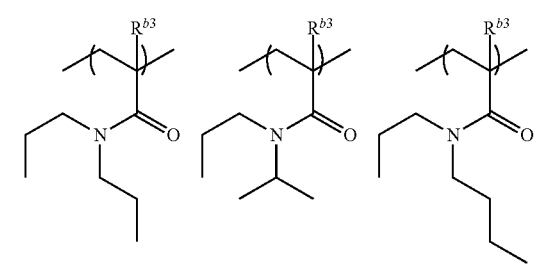
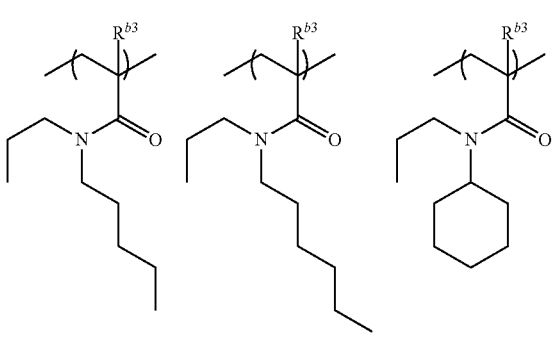
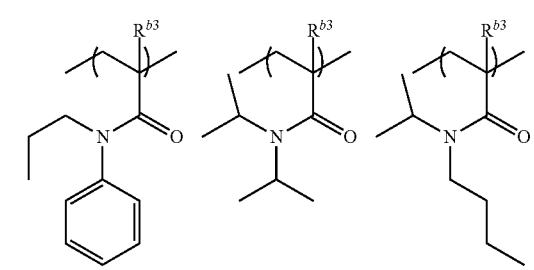
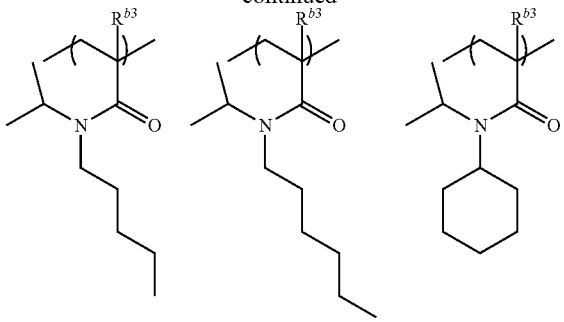
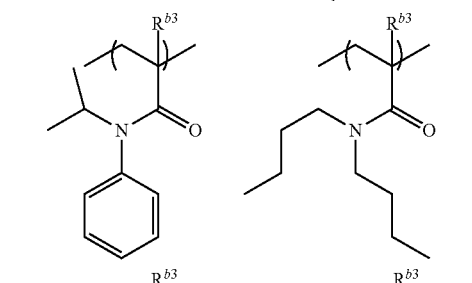
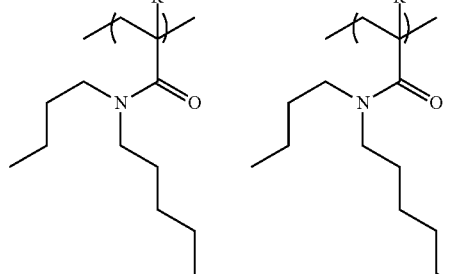
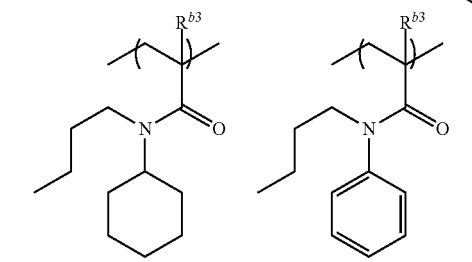
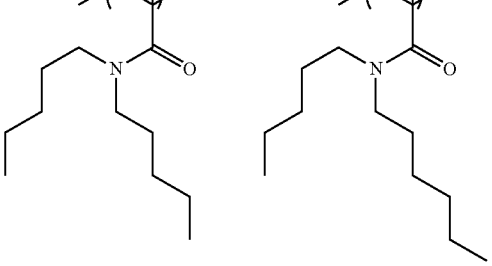
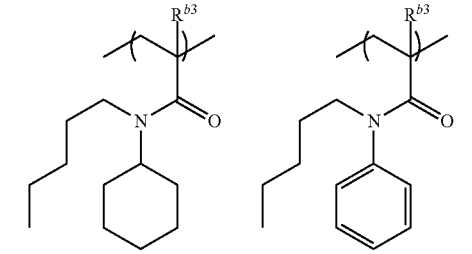

-continued

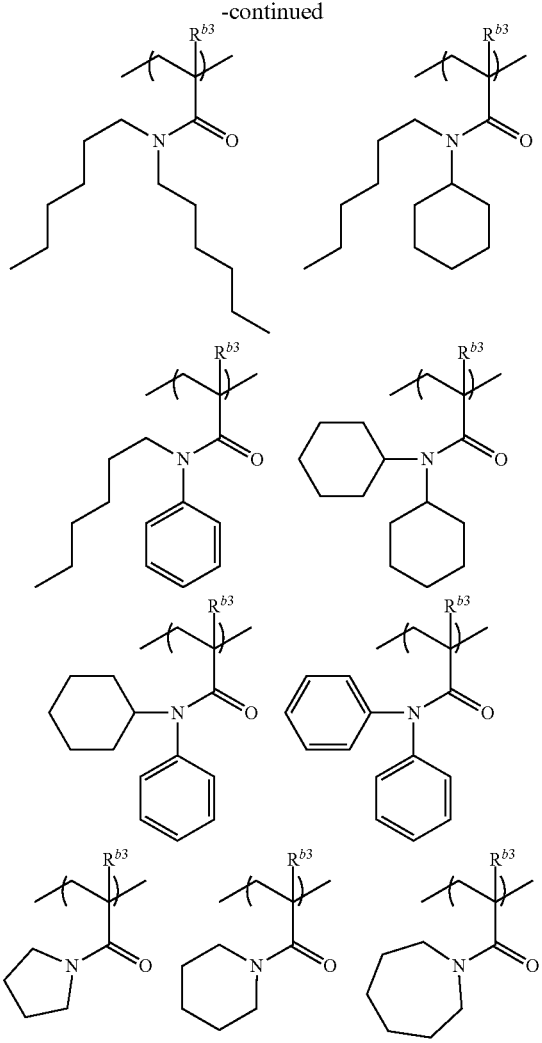

Because a cleaning solution having a particularly excellent anticorrosive effect on silicon nitride is easily obtained, the compound providing a unit represented by the formula (b1) is more preferably a unit represented by the following formula (b1-1). A polymer, which is a unit represented by the formula (b1-1):

[Chem. 10]

(b1-1)

(in the formula (b1-1), p is an integer of 1 or more 10 or less), is preferable.

In the formula (b1-1), p is an integer of 1 or more 10 or less, and preferably an integer of 1 or more 8 or less, more preferably an integer of 1 or more 5 or less, particularly preferably an integer of 1 or more 3 or less, and most preferably 1.

The unit represented by the above formula (b1-1) includes a pyrrolidone ring in a case where p is 1, a piperidone ring in a case where p is 2, and an azepanone ring in a case where p is 3.

In a case where p is 1, the compound providing a unit represented by the formula (b1-1) is N-vinyl-2-pyrrolidone. In a case where p is 2, the compound providing a unit represented by the formula (b1-1) is N-vinyl-2-piperidone. In a case where p is 3, the compound providing a unit represented by the formula (b1-1) is N-vinyl-2-azepanone.

As with the case of the polymer including a unit represented by the above formula (b1), the polymer including a unit represented by the formula (b1-1) can be a homopolymer including only a unit represented by the formula (b1-1) or a copolymer including a unit represented by the formula (b1-1) and another unit other than a unit represented by the formula (b1-1). The polymer is preferably a polymer having only a unit represented by the formula (b1-1), and more preferably a polymer having only a unit represented by the formula (b1-1) wherein p is 1, that is polyvinylpyrrolidone.

The amount of the above-described corrosion inhibitor (B) used in the cleaning solution is not particularly limited. The amount of corrosion inhibitor (B) included in the cleaning solution is preferably 0.01 mass % or more 10 mass % or less, more preferably 0.03 mass % or more 5 mass % or less, and particularly preferably 0.05 mass % or more 1 mass % or less. In a case where a corrosion inhibitor (B) is used in an amount within the range, a cleaning solution having both an excellent cleaning effect on various residues and an excellent anticorrosive effect on silicon nitride is easily obtained.

<Solvent (S)>

The cleaning solution essentially includes a solvent (S). The solvent (S) is typically a solvent having mainly water, and can be a solvent having only water, a mixed solvent of water and a water-soluble organic solvent, or a solvent having only a water-soluble organic solvent. The amount of water included is preferably 1.0 mass % or more 99.9 mass % or less in the cleaning solution. In a case where the solvent (S) includes mainly water, the amount of water included in the cleaning solution is more preferably 80 mass % or more 99.9 mass % or less, particularly preferably 90 mass % or more 99.9 mass % or less, further preferably 95 mass % or more 99.9 mass % or less, and most preferably 98 mass % or more 99.9 mass % or less. In a case where the solvent (S) includes water and a water-soluble organic solvent, the amount of water included in the cleaning solution can be, for example, 15 mass % or more 40 mass % or less. In addition, when the solvent (S) is a mixed solvent of water and a water-soluble organic solvent, the amount of water-soluble organic solvent included in the cleaning solution is preferably 1.0 mass % or more 90 mass % or less, more preferably 10 mass % or more 80 mass % or less, and particularly preferably 20 mass % or more 50 mass % or less.

Examples of the water-soluble organic solvent which may be included in the cleaning solution include sulfoxides such as dimethylsulfoxide; sulfones such as dimethylsulfone, diethylsulfone, bis(2-hydroxyethyl)sulfone, and tetramethylenesulfone; amides such as N,N-dimethylformamide, N-methylformamide, N,N-dimethylacetamide, N-methylacetamide, and N,N-diethylacetamide; lactams such as N-methyl-2-pyrrolidone, N-ethyl-2-pyrrolidone, N-propyl-2-pyrrolidone, N-hydroxymethyl-2-pyrrolidone, and N-hydroxyethyl-2-pyrrolidone; imidazolidinones such as 1,3-dimethyl-2-imidazolidinone, 1,3-diethyl-2-imidazolidinone, and 1,3-diisopropyl-2-imidazolidinone; lactones such as γ-butyrolactone and δ-valerolactone; polyhydric alcohols and derivatives thereof such as ethylene glycol, propylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, and diethylene glycol monobutyl ether; and the like.

In addition, N,N-dialkyl fatty acid amide represented by the following formula (s-1) is also preferable as the water-soluble organic solvent. In a case where the cleaning solution includes N,N-dialkyl fatty acid amide represented by the formula (s-1), a cleaning solution of which the etching rate hardly changes even due to continuous use is easily obtained.

[Chem. 11]

(s-1)

(In the formula (s-1), $R^{1s}$ represents an isopropyl group or a 1-hydroxy-1-methylethyl group, and $R^{2s}$ and $R^{3s}$ each independently represent an alkyl group having 1 or more 4 or less carbon atoms.)

$R^{2s}$ and $R^{3s}$ are each independently an alkyl group having 1 or more 4 or less carbon atoms. The alkyl group may be linear or branched. Specific examples of the alkyl group having 1 or more 4 or less carbon atoms include a methyl group, an ethyl group, an n-propyl group, an isopropyl group, an n-butyl group, a sec-butyl group, an isobutyl group, and a tert-butyl group. Among these alkyl groups, a methyl group and an ethyl group are preferable.

Specific examples of N,N-dialkyl fatty acid amide represented by the formula (s-1) include N,N-dimethylisobutylamide, N-ethyl, N-methylisobutylamide, N,N-diethylisobutylamide, 2-hydroxy-N,N,2-trimethylpropanamide, N-ethyl-2-hydroxy-N,2-dimethylpropanamide, and N,N-diethyl-2-hydroxy-2-methylpropanamide, and the like. Among these, N,N-dimethylisobutylamide, N-ethyl,N-methylisobutylamide, 2-hydroxy-N,N,2-trimethylpropanamide, and N-ethyl-2-hydroxy-N,2-dimethylpropanamide are preferable, and particularly N,N-dimethylisobutylamide, and 2-hydroxy-N,N,2-trimethylpropanamide are more preferable. The cleaning solution may include a combination of two or more N,N-dialkyl fatty acid amides as the water-soluble organic solvent.

Furthermore, 3-alkoxy-3-methyl-1-butanol represented by the following formula (s-2) is also preferable as the water-soluble organic solvent. 3-Alkoxy-3-methyl-1-butanol has a particularly excellent performance of removing residues.

[Chem. 12]

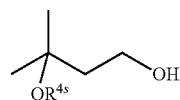

(s-2)

(wherein, $R^{4s}$ represents an alkyl group having 1 or more 5 or less carbon atoms.)

Examples of the alkyl group having 1 or more 5 or less carbon atoms represented by $R^{4s}$ in the formula (s-2) include a methyl group, an ethyl group, an n-propyl group, an isopropyl group, an n-butyl group, an isobutyl group, a t-butyl group, an n-pentyl group and the like. Among these, an alkyl group having 1 or more 3 or less carbon atoms is preferable, a methyl group or an ethyl group is more preferable, and a methyl group is further preferable from the viewpoint of solvency. 3-Methoxy-3-methyl-1-butanol (MMB) is particularly preferable as 3-alkoxy-3-methyl-1-butanol represented by the formula (s-2).

<Basic Compound (C)>

The cleaning solution may include a basic compound (C) other than the above corrosion inhibitor (B). The type of basic compound (C) is not particularly limited, and is properly selected from inorganic or organic basic compounds which have been conventionally blended in cleaning solutions which are used to clean residues of e.g. a photoresist. The basic compound (C) is preferably a nitrogen-containing basic compound.

Specific examples of inorganic basic compounds which may be included in the cleaning solution include ammonia, hydroxylamine, hydrazine, alkali metal hydroxides such as potassium hydroxide and sodium hydroxide, alkali metal carbonates such as potassium carbonate and sodium carbonate, alkali metal bicarbonate such as potassium bicarbonate and sodium bicarbonate, and the like.

Specific examples of organic basic compounds which may be included in the cleaning solution include quaternary ammonium hydroxides such as tetramethylammonium hydroxide, tetraethylammonium hydroxide, tetrapropylammonium hydroxide, tetrabutylammonium hydroxide, methyltripropylammonium hydroxide, methyltributylammonium hydroxide and choline; silazane compounds such as hexamethyldisilazane and hexaethyldisilazane; aminosilane compounds such as trimethylsilyl dimethylamine and trimethylsilyl diethylamine; and hydroxylamine compounds such as diethylhydroxylamine. In addition, the following organic amines are also suitable as the basic compound (C). Specific examples of organic amines are methoxymethylamine, methoxyethylamine, methoxypropylamine, methoxybutylamine, ethoxymethylamine, ethoxyethylamine, ethoxypropylamine, ethoxybutylamine, propoxymethylamine, propoxyethylamine, propoxypropylamine, propoxybutylamine, butoxymethylamine, butoxyethylamine, butoxypropylamine, butoxybutylamine, methylamine, ethylamine, propylamine, butylamine, N,N-dimethylamine, N,N-diethylamine, N,N-dipropylamine, N,N-dibutylamine, trimethylamine, triethylamine, tripropylamine, tributylamine, dimethylaminopropylamine, 2-ethylhexylamine, tetrahydrofurfurylamine, tetramethylethylenediamine, tetraethylethylenediamine, tetrapropylethylenediamine and tetrabutylethylenediamine, methylaminobutylamine, ethylaminobutylamine, propylaminobutylamine, butylaminobutylamine, pyridine, pyrrole, piperazine, pyrrolidine, piperidine, picoline, morpholine, methylmorpholine, diazabicyclooctane, diazabicyclononane and diazabicycloundecene, and the like.

In addition, a compound represented by the following formula (c-1) is also preferable as the basic compound (C).

[Chem. 13]

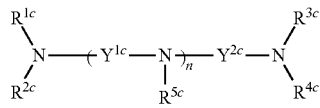

(c-1)

(in the formula (c-1), $R^{1c}$ to $R^{5c}$ each independently represent a hydrogen atom, or an alkyl group having 1 or more 6 or less carbon atoms which may have a hydroxy group, a carboxyl group, an amino group or a phosphonic acid group, and at least one of $R^{1c}$ to $R^{5c}$ is a hydrogen atom. Any one of $R^{1c}$ to $R^{4c}$ and $R^{5c}$ may be bound to each other to form a ring structure. $Y^{1c}$ and $Y^{2c}$ each independently represent an alkylene group having 1 or more 3 or less carbon atoms, and n represents an integer of 0 or more 5 or less. In a case where n is 2 or more, a plurality of $R^{5c}$(s) each other and a plurality of $Y^{1c}$(s) each other may be the same or different, and $R^{5c}$(s) may be bound to each other to form a ring structure.)

The alkyl group having 1 or more 6 or less carbon atoms which can be $R^{1c}$ to $R^{5c}$ may be either linear or branched, and is preferably linear. Specific examples thereof include a methyl group, an ethyl group, an n-propyl group, an n-butyl group, an n-pentyl group, an n-hexyl group and the like. Among these, an ethyl group is most preferable. This alkyl group may have a hydroxy group, a carboxyl group, an amino group or a phosphonic acid group. Specific examples of such alkyl group include a 2-hydroxyethyl group, a 2-carboxyethyl group, a 2-aminoethyl group, an ethyl 2-phosphonate group and the like.

Examples of ring structures which can be formed by binding any one of $R^{1c}$ to $R^{4c}$ and $R^{5c}$ each other or ring structures which can be formed by binding $R^{5c}$(s) each other include a piperazine ring and the like.

The alkylene group having 1 or more 3 or less carbon atoms which can be $Y^{1c}$ and $Y^{2c}$ may be either linear or branched, and is preferably linear. Specific examples thereof include a methylene group, an ethylene group, a propylene group and the like. Among these, an ethylene group is most preferable.

n represents an integer of 0 or more 5 or less, and is more preferably an integer of 0 or more 2 or less.

Specific examples of the basic compound represented by the above formula (c-1) include ethylenediamine, N-(2-aminoethyl)-1,2-ethanediamine (=diethylenetriamine), N,N'-bis(2-aminoethyl)-1,2-ethanediamine (=triethylenetetramine), tris(2-aminoethyl)amine, N,N'-bis(2-aminoethyl)piperazine, N-[(2-aminoethyl)-2-aminoethyl]piperazine, N-(2-aminoethyl)-N'-{2-[(2-aminoethyl)amino]ethyl}-1,2-ethanediamine (=tetraethylenepentamine), 4-(2-aminoethyl)-N-(2-aminoethyl)-N'-{2-[(2-aminoethyl)amino] ethyl}-1,2-ethanediamine, 1-(2-aminoethyl)-4-{[(2-aminoethyl)amino]ethyl}piperazine, 1-{2-[[2-[(2-aminoethyl)amino]ethyl]amino]ethyl}piperazine, 1-piperazineethanamine, 2-[(2-aminoethyl)amino]ethanol and the like.

Among basic compounds represented by the above formula (c-1), a basic compound represented by the following general formula (c-2) is preferable.

[Chem. 14]

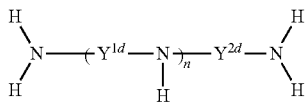

(c-2)

(In the formula (c-2), $Y^{1c}$, $Y^{2c}$ and n have the same meaning as in the formula (C-1).)

Specific examples of the basic compound represented by the formula (c-2) include ethylenediamine, N-(2-aminoethyl)-1,2-ethanediamine (=diethylenetriamine), N,N'-bis(2-aminoethyl)-1,2-ethanediamine (=triethylenetetramine), tetraethylenepentamine, pentaethylenehexamine, dimethylenetriamine, trimethylenetetramine and the like.

Among these, N-(2-aminoethyl)-1,2-ethanediamine (=diethylenetriamine), N,N'-bis(2-aminoethyl)-1,2-ethanediamine (=triethylenetetramine) are particularly preferable.

The above-described basic compounds (C) may be used alone or two or more basic compounds (C) may be used in combination.

The amount of basic compound (C) included can be properly adjusted depending on the amount of hydrofluoric acid included, and is preferably 0.01 mass % or more 2.00 mass % or less, and more preferably 0.01 mass % or more 1.24 mass % or less in the cleaning solution. It is easy to more effectively achieve a balance between properties of cleaning and removing various residues and anticorrosion properties to silicon nitride.

The pH of the cleaning solution in a state in which a basic compound (C) is added or not added is preferably 2 or more 7 or less, and particularly preferably 2 or more 6 or less from the viewpoint of an excellent balance between cleaning performance and an anticorrosive effect on silicon nitride. It should be noted that the pH of the cleaning solution is a value measured at 25° C.

<Other Components>

The cleaning solution may further include a corrosion inhibitor which has been conventionally blended in a cleaning solution other than the above corrosion inhibitor (B). This corrosion inhibitor is not particularly limited, and a conventionally known corrosion inhibitor can be used, which is preferably a benzotriazole compound or a mercapto group-containing compound.

Examples of the above benzotriazole compound can include a compound represented by the following formula (d-1).

[Chem. 15]

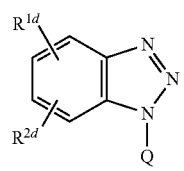

(d-1)

In the above formula (d-1), $R^{1d}$ and $R^{3c}$ each independently represent a hydrogen atom, an optionally substituted hydrocarbon group having 1 or more 10 or less carbon atoms, a carboxyl group, an amino group, a hydroxy group, a cyano group, a formyl group, a sulfonylalkyl group, or a sulfo group, and Q represents a hydrogen atom, a hydroxy group, an optionally substituted hydrocarbon group having 1 or more 14 or less carbon atoms (where the hydrocarbon group may be interrupted by an amide bond or an ester bond), or a group represented by the following formula (d-2).

[Chem. 16]

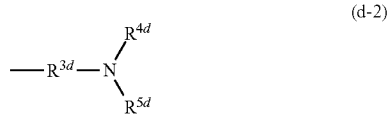

In the above formula (d-2), $R^{3d}$ represents an alkylene group having 1 or more 6 or less carbon atoms, and $R^{4d}$ and $R^{5d}$ each independently represent a hydrogen atom, a hydroxy group, or a hydroxyalkyl group or alkoxyalkyl group having 1 or more 6 or less carbon atoms.

In each definition of $R^{1d}$, $R^{2d}$, and Q in the above formula (d-1), the hydrocarbon group may be either an aromatic hydrocarbon group or an aliphatic hydrocarbon group, may include an unsaturated bond, and may be any of linear, branched, and cyclic. Examples of the aromatic hydrocarbon group include a phenyl group, a p-tolyl group and the like. Examples of the linear aliphatic hydrocarbon group include a methyl group, an n-propyl group, a vinyl group and the like. Examples of the branched aliphatic hydrocarbon group include an isobutyl group, a tert-butyl group and the like. Examples of the cyclic aliphatic hydrocarbon group include a cyclopentyl group, a cyclohexyl group and the like. Examples of the substituted hydrocarbon group include a hydroxyalkyl group, an alkoxyalkyl group and the like.

In addition, Q in the above formula (d-1) is preferably a group represented by the above formula (d-2). In particular, among the groups represented by the above formula (d-2), it is preferable to select a group in which Rod and $R^{5d}$ are each independently a hydroxyalkyl group or an alkoxyalkyl group having 1 or more 6 or less carbon atoms.

Furthermore, it is preferable to select Q such that the compound represented by the above formula (d-1) exhibits water solubility. Specifically, a hydrogen atom, an alkyl group having 1 or more 3 or less carbon atoms (that is, a methyl group, an ethyl group, a propyl group, or an isopropyl group), a hydroxyalkyl group having 1 or more 3 or less carbon atoms, a hydroxy group, and the like are preferable.

Specific examples of the benzotriazole compound include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, methyl 1-benzotriazole carboxylate, 5-benzotriazole carboxylic acid, 1-methoxy-benzotriazole, 1-(2,2-dihydroxyethyl)-benzotriazole, and 1-(2,3-dihydroxypropyl)benzotriazole; and 2,2'-{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane, 2,2'-{[(4-methyl-1H-benzotriazol-1-yl)methyl]imino}bispropane, and the like that are commercially available from BASF as "IRGAMET" series. Among these, 1-(2,3-dihydroxypropyl)-benzotriazole, 2,2'-{[(4-methyl-1H-benzotriazol-1-yl)methyl]imino}bisethanol, 2,2'-{[(5-methyl-1H-benzotriazol-1-yl)methyl]imino}bisethanol, and the like are preferable. These benzotriazole compounds may be used alone, or two or more benzotriazole compounds may be used in combination.

The above mercapto group-containing compound is preferably a compound having a hydroxy group and/or a carboxyl group on at least one of the α-position and the β-position of the carbon atom that is bonded to the mercapto group. Specific examples of such compounds include 1-thioglycerol, 3-(2-aminophenylthio)-2-hydroxypropylmercaptan, 3-(2-hydroxyethylthio)-2-hydroxypropylmercaptan, 2-mercaptopropionic acid, 3-mercaptopropionic acid and the like. Among these, it is particularly preferable to use 1-thioglycerol. These mercapto group-containing compounds may be used alone, or two or more mercapto group-containing compounds may be used in combination.

In a case where a corrosion inhibitor is included, the amount included is preferably 0.1 mass % or more 10 mass % or less and more preferably 0.5 mass % or more 5 mass % or less in the cleaning solution.

In addition, the cleaning solution according to the present invention may further include a surfactant. The surfactant is not particularly limited, and it is possible to use a conventionally known surfactant, which is preferably an acetylene alcohol-based surfactant.

In a case where a surfactant is included, the amount included is preferably 0.01 mass % or more 5 mass % or less and more preferably 0.05 mass % or more 2 mass % or less in the cleaning solution.

The cleaning solution essentially includes the above component (A), component (B) and component (S) and thus can suitably clean photoresist pattern residues or etching residues, and also has an excellent anticorrosion properties to silicon nitride. For this reason, the above-described cleaning solution is suitably used for cleaning a substrate in a case where at least a part of the surface of the substrate has silicon nitride. Particularly, the above-described cleaning solution is suitably used as a cleaning solution used when chemical mechanical polishing (CMP) is carried out using a substrate including a layer having silicon nitride, for example, as a stopper layer.

The cleaning method is not particularly limited, and examples thereof include an immersion method, a spray method and the like. The treatment can be carried out by either a batch-type or a single wafer processing. The time period for the cleaning and removing is not particularly limited, and is typically about 10 minutes or more 30 minutes or less in a batch processing and about 0.5 minutes or more 3 minutes or less in a single wafer processing. The cleaning solution according to the present invention is preferably used for a single wafer processing. The temperature of the cleaning solution is not particularly limited, and is typically about 25 or higher 70° C. or lower. After the cleaning using the cleaning solution, a rinse treatment with pure water, a lower alcohol or the like, and a dry treatment may be also carried out.

EXAMPLES

The present invention will now be described in more detail by way of Examples of the present invention. It should be noted, however, that the present invention is not limited to the following Examples.

Examples 1 to 6, and Comparative Examples 1 to 7

(Preparation of Cleaning Solution)

Cleaning solutions in Examples 1 to 6 and Comparative Examples 2 to 7 were prepared by uniformly mixing 0.1 mass % of hydrofluoric acid, 0.1 mass % of corrosion inhibitor of a type shown in Table 1, and water as the remainder. A cleaning solution in Comparative Example 1 was prepared in the same manner as for the cleaning solutions in Examples except that a corrosion inhibitor was not used. The values of pH of the cleaning solutions in Examples and Comparative Examples measured at 25° C. are shown in Table 1.

B1 to B12 described below were used as a corrosion inhibitor in Examples and Comparative Examples. B1: polyvinylpyrrolidone (mass average molecular weight 9,000),
B2: polyvinylpyrrolidone (mass average molecular weight 40,000),
B3: polyvinylpyrrolidone (mass average molecular weight 45,000),
B4: polyvinylpyrrolidone (mass average molecular weight 80,000),
B5: polyvinylpyrrolidone (mass average molecular weight 140,000),
B6: polyvinylpyrrolidone (mass average molecular weight 1,200,000),
B7: N-vinylpyrrolidone,
B8: pyrazole,
B9: pyrrole,
B10: imidazole,
B11: 1,2,4-triazole, and
B12: 5-aminotetrazole.

(Evaluation of Anticorrosion Properties to Silicon Nitride)

A substrate including a silicon nitride layer with a thickness of 100 nm as an outermost layer was used for evaluation of anticorrosion properties. The substrate was immersed in the cleaning solutions in Examples and Comparative Examples at 50° C. for 30 minutes. After the immersion, the surface of the substrate was rinsed with water, and then, the substrate was dried through blowing nitrogen. A film thickness (A) of the silicon nitride layer of the substrate after the drying was measured through an ellipsometer to measure the film thickness (A) of the silicon nitride layer after the immersion. The amount of film loss of the silicon nitride layer was found from a change in the film thickness of the silicon nitride layer before and after the immersion. The measurement results of amount of film loss (Å/30 min.) are shown in Table 1.

TABLE 1

| | Corrosion inhibitor | | | Amount of film loss of silicon nitride (Å/30 min.) |
|---|---|---|---|---|
| | Type | Mass average molecular weight | pH of cleaning solution | |
| Example 1 | B1 | 9,000 | 2.30 | 155.4 |
| Example 2 | B2 | 40,000 | 2.29 | 136.8 |
| Example 3 | B3 | 45,000 | 2.31 | 142.2 |
| Example 4 | B4 | 80,000 | 2.31 | 142.3 |
| Example 5 | B5 | 140,000 | 2.31 | 69.5 |
| Example 6 | B6 | 1,200,000 | 2.33 | 141.6 |
| Example 1 | None | — | 2.26 | 182.8 |
| Example 2 | B7 | — | 2.32 | 182.0 |
| Example 3 | B8 | — | 2.63 | 186.2 |
| Example 4 | B9 | — | 2.33 | 182.5 |
| Example 5 | B10 | — | 2.88 | 176.2 |
| Example 6 | B11 | — | 2.67 | 193.7 |
| Example 7 | B12 | — | 2.36 | 181.0 |

It can be seen from Examples and Comparative Examples that the film loss of silicon nitride is significantly inhibited when using the cleaning solutions in Examples including polyvinylpyrrolidone as a corrosion inhibitor, while the film loss of silicon nitride is significant when using the cleaning solutions in Comparative Examples which include a nitrogen-containing heterocyclic compound other than polyvinylpyrrolidone or do not include a corrosion inhibitor.

That is, it can be seen from a comparison of Examples and Comparative Examples that polyvinylpyrrolidone can reduce corrosion of silicon nitride.

Example 7

A cleaning solution in Example 7 was obtained by mixing 0.1 mass % of hydrofluoric acid, 0.5 mass % of poly(N-(2-hydroxyethyl)acrylamide as a corrosion inhibitor, and water as the remainder. The anticorrosion properties to silicon nitride were evaluated using the cleaning solution in Example 7, and the amount of film loss of silicon nitride was 50% or less of the amount of film loss when using the cleaning solution in Comparative Example 1 not including a corrosion inhibitor.

Example 8

A cleaning solution in Example 8 was obtained by mixing 0.1 mass % of hydrofluoric acid, 0.5 mass % of poly(N,N-dimethylacrylamide) as a corrosion inhibitor, and water as the remainder. The anticorrosion properties to silicon nitride were evaluated using the cleaning solution in Example 8, and the amount of film loss of silicon nitride was 50% or less of the amount of film loss when using the cleaning solution in Comparative Example 1 not including a corrosion inhibitor.

The invention claimed is:

1. A cleaning solution comprising hydrofluoric acid (A), a corrosion inhibitor (B) and a solvent (S),
   wherein the corrosion inhibitor comprises a polymer comprising one or more units represented by the following formula (b1) or formula (b2):

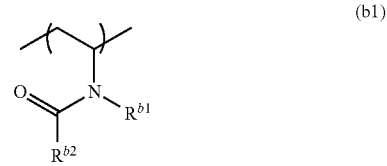
(b1)

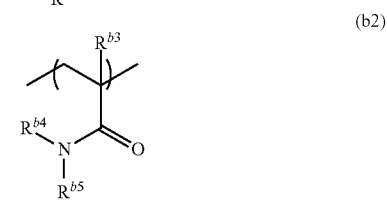
(b2)

wherein in the formula (b1), $R^{b1}$ and $R^{b2}$ are each independently a hydrogen atom or a hydrocarbon group having 1 or more 6 or less carbon atoms, and $R^{b1}$ and $R^{b2}$ are optionally bound to each other to form a ring, and
in the formula (b2), $R^{b3}$ is a hydrogen atom or a methyl group, and $R^{b4}$ and $R^{b5}$ are each independently a hydrogen atom, or a hydrocarbon group having 1 or more 6 or less carbon atoms which is optionally substituted with one or more hydroxy groups, and $R^{b4}$ and $R^{b5}$ are optionally bound to each other to form a ring,
wherein the cleaning solution does not comprise an amine.

2. The cleaning solution according to claim 1,
   wherein the unit represented by the formula (b1) is a unit represented by the following formula (b1-1):

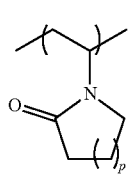

(b1-1)

wherein p is an integer of 1 or more 10 or less.

3. The cleaning solution according to claim 2, wherein p is 1.

4. The cleaning solution according to claim 1, wherein the polymer is polyvinylpyrrolidone.

5. The cleaning solution according to claim 1, wherein a mass average molecular weight of the polymer is 1000 or more 2000000 or less.

6. The cleaning solution according to claim 1, wherein the solvent (S) comprises water.

7. A method for cleaning a substrate comprising contacting the substrate with the cleaning solution according to claim 1.

8. The method according to claim 7, wherein the substrate comprises a silicon nitride layer.

* * * * *